(12) United States Patent
Akada

(10) Patent No.: US 11,217,468 B2
(45) Date of Patent: Jan. 4, 2022

(54) SUBSTRATE TREATMENT APPARATUS

(71) Applicant: Tokyo Electron Limited, Tokyo (JP)

(72) Inventor: Hikaru Akada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 451 days.

(21) Appl. No.: 16/199,699

(22) Filed: Nov. 26, 2018

(65) Prior Publication Data
US 2019/0172741 A1    Jun. 6, 2019

(30) Foreign Application Priority Data

Dec. 5, 2017   (JP) .............................. JP2017-233621

(51) Int. Cl.
| | | |
|---|---|---|
| H01L 21/677 | (2006.01) | |
| G03F 7/09 | (2006.01) | |
| H01L 21/67 | (2006.01) | |
| H05K 5/02 | (2006.01) | |
| H05K 7/18 | (2006.01) | |
| H05K 7/16 | (2006.01) | |
| H01R 4/50 | (2006.01) | |

(52) U.S. Cl.
CPC ........ *H01L 21/67742* (2013.01); *G03F 7/091* (2013.01); *H01L 21/6719* (2013.01); *H01L 21/67178* (2013.01); *H01R 4/50* (2013.01); *H05K 5/0204* (2013.01); *H05K 7/16* (2013.01); *H05K 7/183* (2013.01); *H01L 21/67011* (2013.01)

(58) Field of Classification Search
CPC ......... H01L 21/67763; H01L 21/67766; H01L 21/67775; H01L 21/67778; H01L 21/67784
See application file for complete search history.

(56) References Cited

U.S. PATENT DOCUMENTS

| | | | |
|---|---|---|---|
| 2005/0158152 A1* | 7/2005 | Otaguro | H01L 21/67733 414/217 |
| 2007/0055404 A1* | 3/2007 | Flitsch | H01L 21/67769 700/213 |
| 2009/0178751 A1* | 7/2009 | Presley | H01L 21/67225 156/60 |
| 2020/0029480 A1* | 1/2020 | Sanji | H05K 13/0495 |

FOREIGN PATENT DOCUMENTS

JP    2006-332542 A    12/2006

* cited by examiner

*Primary Examiner* — Jae Lee
(74) *Attorney, Agent, or Firm* — Posz Law Group, PLC

(57) ABSTRACT

A substrate treatment apparatus for treating a substrate, the substrate treatment apparatus includes: an apparatus main body configured to perform a predetermined treatment on the substrate; a casing configured to house a predetermined component therein and to be attachable to and detachable from an upper part of the apparatus main body; a casing side connection part provided at the casing and connected to the predetermined component; a main body side connection part provided at the upper part of the apparatus main body and configured to be fitted into the casing side connection part; a guide part provided at the upper part of the apparatus main body and configured to move the casing in one direction; and a connection assisting mechanism configured to fit the casing side connection part into the main body side connection part while moving the casing in the one direction.

14 Claims, 15 Drawing Sheets

FIG.6
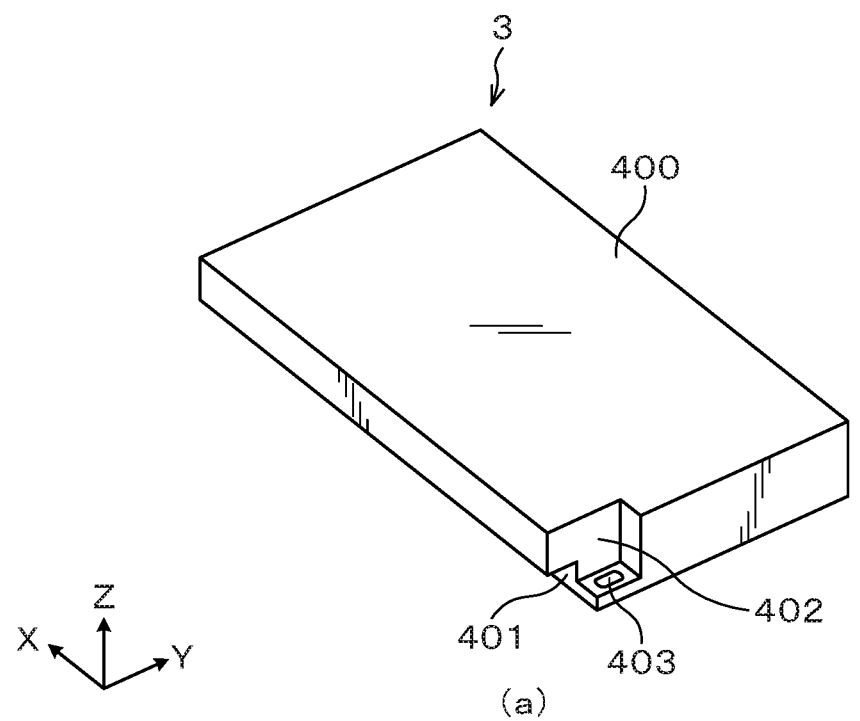
(a)
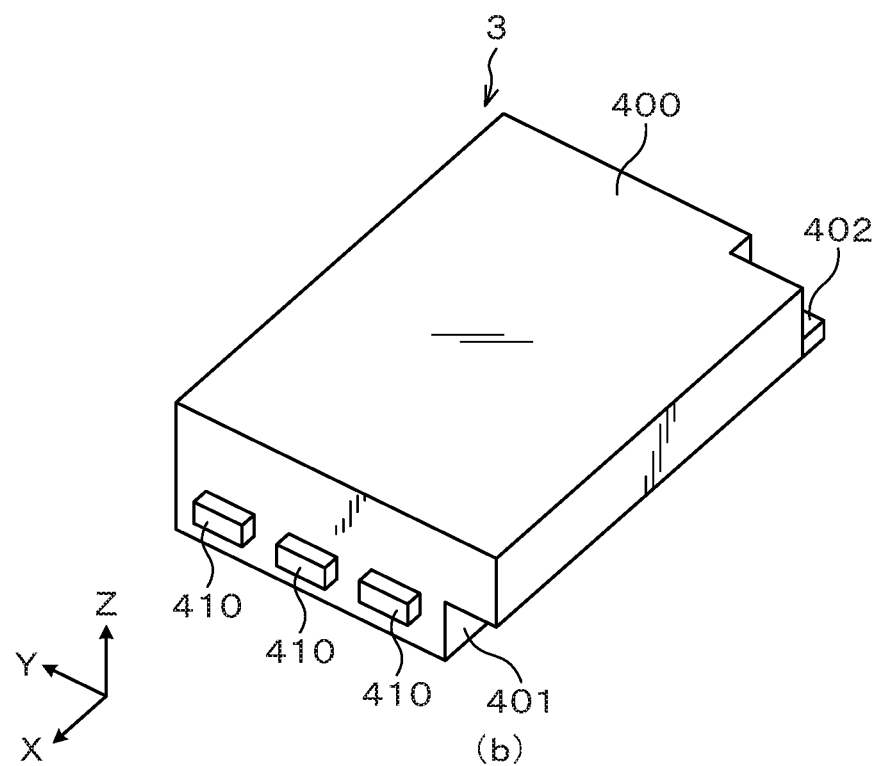
(b)

FIG.13
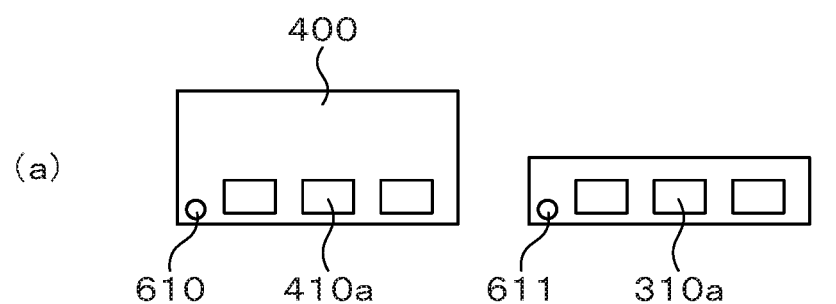
(a)
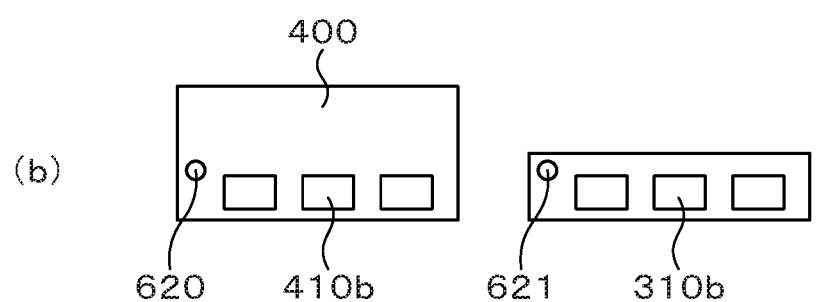
(b)
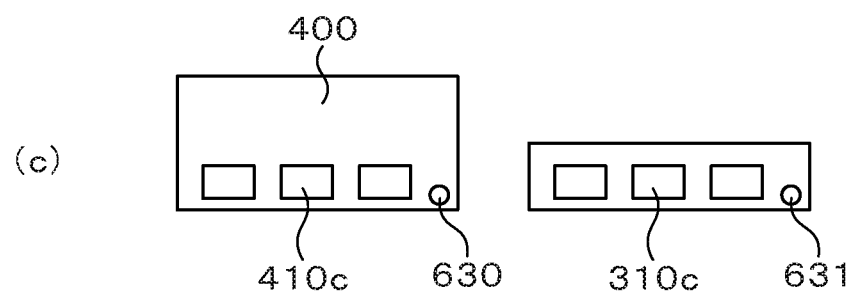
(c)

SUBSTRATE TREATMENT APPARATUS

CROSS REFERENCE TO RELATED APPLICATIONS

This application is based upon and claims the benefit of priority of the prior Japanese Patent Application No. 2017-233621, filed in Japan on Dec. 5, 2017, the entire contents of which are incorporated herein by reference.

BACKGROUND OF THE INVENTION

1. Field of the Invention

This disclosure relates to a substrate treatment apparatus, a method for installing the substrate treatment apparatus, and a computer storage medium.

2. Description of the Related Art

In a photolithography process in a manufacturing process of a semiconductor device, for example, a coating treatment of supplying a coating solution onto a surface of a semiconductor wafer (hereinafter, referred to as a "wafer") as a substrate to form an anti-reflection film or a resist film, exposure processing of exposing the resist film in a predetermined pattern, a developing treatment of developing the exposed resist film, a thermal treatment of heating the wafer and so on are sequentially performed to form a predetermined resist pattern on the wafer. The series of treatments are performed in a coating and developing treatment apparatus being a substrate treatment apparatus.

The substrate treatment apparatus includes an apparatus main body composed of, for example, various treatment units that treat the wafer, a transfer region for transferring the wafer to the treatment units and so on. Further, to the apparatus main body, for example, an electric component box that houses various electrical components and a fan filter unit that supplies clean air to the apparatus main body are attached.

Incidentally, in the substrate treatment apparatus, the plurality of treatment units are arranged in a stacked manner to reduce its footprint (occupied area). In addition, the electric component box and the fan filter unit are also arranged to be stacked at an upper part of the apparatus main body from the viewpoint of further reducing the footprint. In this case, the height of the substrate treatment apparatus increases to a considerable degree and may exceed the height limit for transportation. When the height exceeds the height loadable on a transportation means such as an aircraft or a truck, the substrate treatment apparatus cannot be transported as it is.

Hence, for example, Japanese Laid-open Patent Publication No. 2006-332542 suggests that in a substrate treatment apparatus including an apparatus main body and accessories such as an electric component box, a fan filter unit and so on, the accessory is turned and displaced, using a turn shaft as a fulcrum at a peripheral part of the upper surface of the apparatus main body, to a use position disposed above the apparatus main body and to a transportation position disposed on a lateral side of the apparatus main body.

SUMMARY OF THE INVENTION

However, in the substrate treatment apparatus disclosed in Japanese Laid-open Patent Publication No. 2006-332542, a large load is applied to the turn shaft when the accessory is turned and displaced, and the turn shaft may be damaged. In this regard, it is conceivable to increase the strength of the turn shaft so that the turn shaft can stand the load, but in this case, the manufacturing cost increases. Further, in the case where the accessory is disposed on the lateral side of the apparatus main body at the time of transportation, the whole apparatus is long in the width direction of the apparatus main body and its balance deteriorates, possibly bringing about a problem in transportation.

It is also conceivable to detach the electric component box and the fan filter unit from the apparatus main body at the time of transportation of the substrate treatment apparatus. However, in this case, it is necessary to perform a work of wire-connecting the electrical component in the electric component box with the apparatus main body at a high place when assembling and installing the substrate treatment apparatus, and there are many portions to be wire-connected, requiring much labor. In addition, there may occur a failure due to wire-connection errors.

In consideration of the above circumstances, a technique according to this disclosure easily installs a substrate treatment apparatus after transportation while suppressing the height of the substrate treatment apparatus during transportation.

An aspect of this disclosure is a substrate treatment apparatus for treating a substrate, the substrate treatment apparatus including: an apparatus main body configured to perform a predetermined treatment on the substrate; a casing configured to house a predetermined component therein and to be attachable to and detachable from an upper part of the apparatus main body; a casing side connection part provided at the casing and connected to the predetermined component; a main body side connection part provided at the upper part of the apparatus main body and configured to be fitted into the casing side connection part; a guide part provided at the upper part of the apparatus main body and configured to move the casing in one direction; and a connection assisting mechanism configured to fit the casing side connection part into the main body side connection part while moving the casing in the one direction.

According to the one aspect of this disclosure, since the casing is configured to be attachable to and detachable from the apparatus main body, the casing can be detached from the apparatus main body so that the height of the substrate treatment apparatus can be suppressed at the time of transporting the substrate treatment apparatus. In addition, no load is applied on the apparatus main body, unlike the substrate treatment apparatus disclosed in above-described Japanese Laid-open Patent Publication No. 2006-332542. Accordingly, the substrate treatment apparatus can be appropriately transported.

Besides, at the time of attaching the casing to the apparatus main body after transportation, the casing is moved in the one direction by the guide part, and then the casing side connection part and the main body side connection part are fitted into each other while the casing is further moved in the one direction using the connection assisting mechanism. The worker can attach the casing to the upper part of the apparatus main body only by moving the casing in the one direction as described above. The wire-connection work for the predetermined component in the casing and the apparatus main body can be performed by fitting the casing side connection part and the main body side connection part using the connection assisting mechanism. Accordingly, the work of attaching the casing at a high place by the worker can be performed on the one surface side so that the substrate treatment apparatus can be easily installed.

One aspect of this disclosure according to another viewpoint is a method for installing a substrate treatment apparatus for treating a substrate to attach a casing housing a predetermined component therein to an upper part of an apparatus main body of the substrate treatment apparatus, the method including: a first step of moving the casing in one direction by a guide part provided at the upper part of the apparatus main body; and a second step of then fitting a casing side connection part provided at the casing and connected to the predetermined component into a main body side connection part provided at the upper part of the apparatus main body, while moving the casing in the one direction using a connection assisting mechanism.

One aspect of this disclosure according to still another viewpoint is a computer-readable storage medium storing a program running on a computer of a control unit controlling a substrate treatment apparatus to cause the substrate treatment apparatus to execute the method for installing the substrate treatment apparatus.

According to the one aspect of this disclosure, the substrate treatment apparatus can be appropriately transported with the height of the substrate treatment apparatus suppressed at the time of transportation. Further, after the transportation, the work of attaching the casing at a high place can be performed on the one surface side so that the substrate treatment apparatus can be easily installed.

BRIEF DESCRIPTION OF THE DRAWINGS

FIG. 6 is a perspective view schematically illustrating the outline of a configuration of an electric component box.

FIG. 13 is an explanatory view illustrating an appearance where bolts and through holes are provided in the electric component box and the ceiling surface of the apparatus main body in another embodiment.

DETAILED DESCRIPTION OF THE INVENTION

Figure 1:
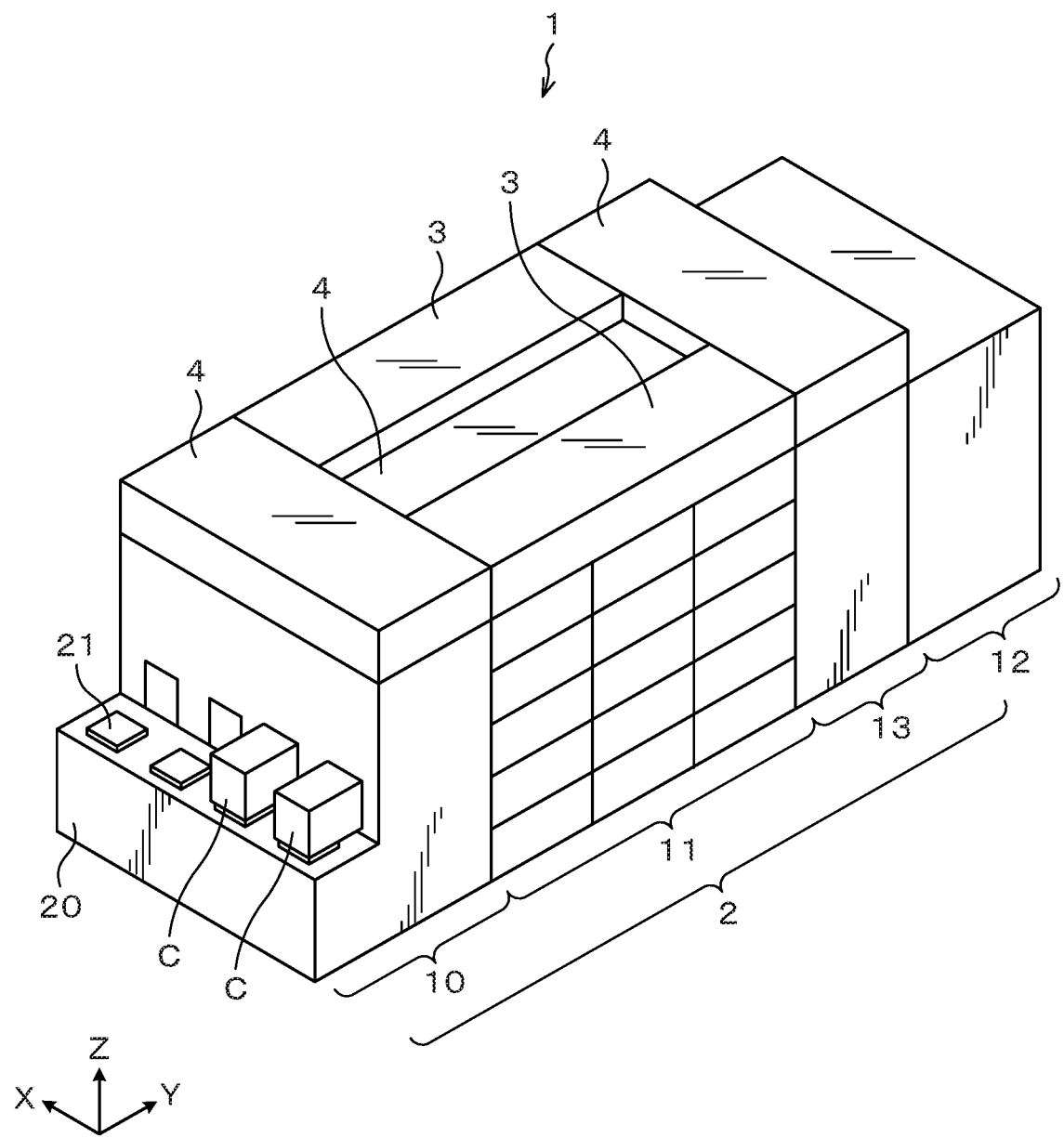
FIG. 1 is a perspective view schematically illustrating the outline of a configuration of a substrate treatment apparatus according to an embodiment.

Hereinafter, embodiments will be explained referring to the drawings. Note that in this description and the drawings, the same codes are given to components having substantially the same functional configurations to omit duplicated explanation.

<Configuration of a Substrate Treatment Apparatus>

Figure 2:
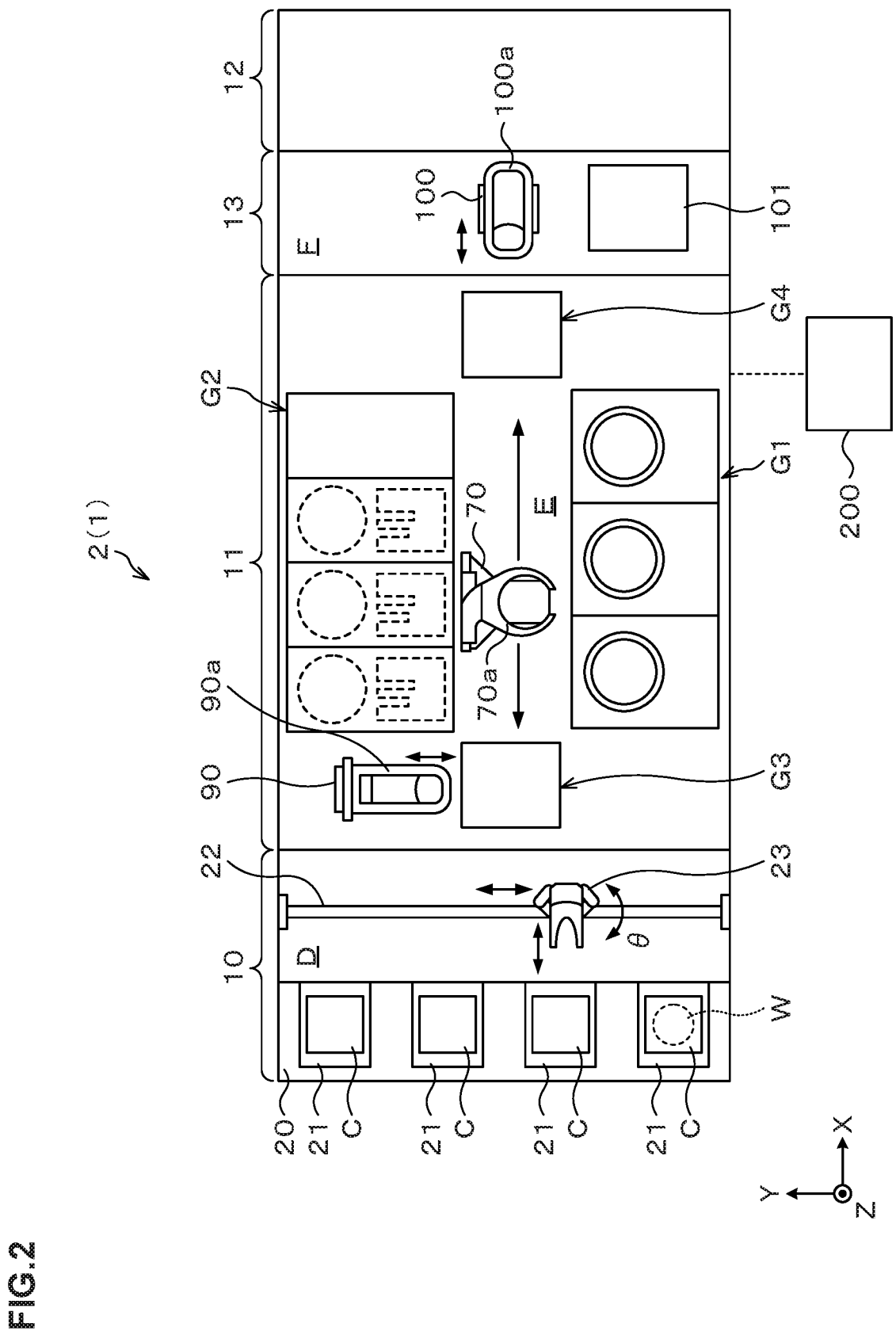
FIG. 2 is a plan view schematically illustrating the outline of the configuration of the substrate treatment apparatus according to the embodiment.
Figure 3:
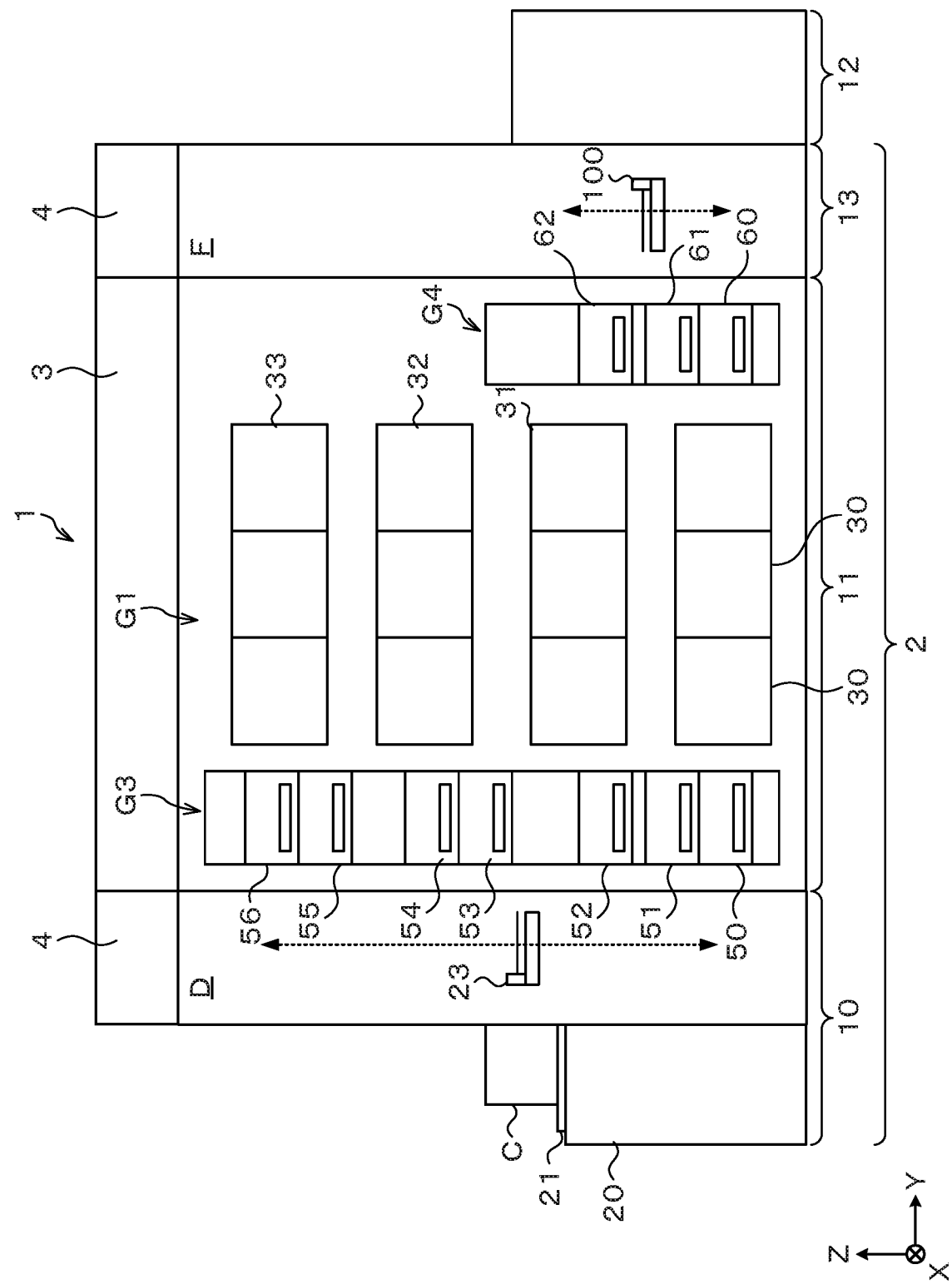
FIG. 3 is a front view schematically illustrating the outline of the configuration of the substrate treatment apparatus according to the embodiment.
Figure 4:
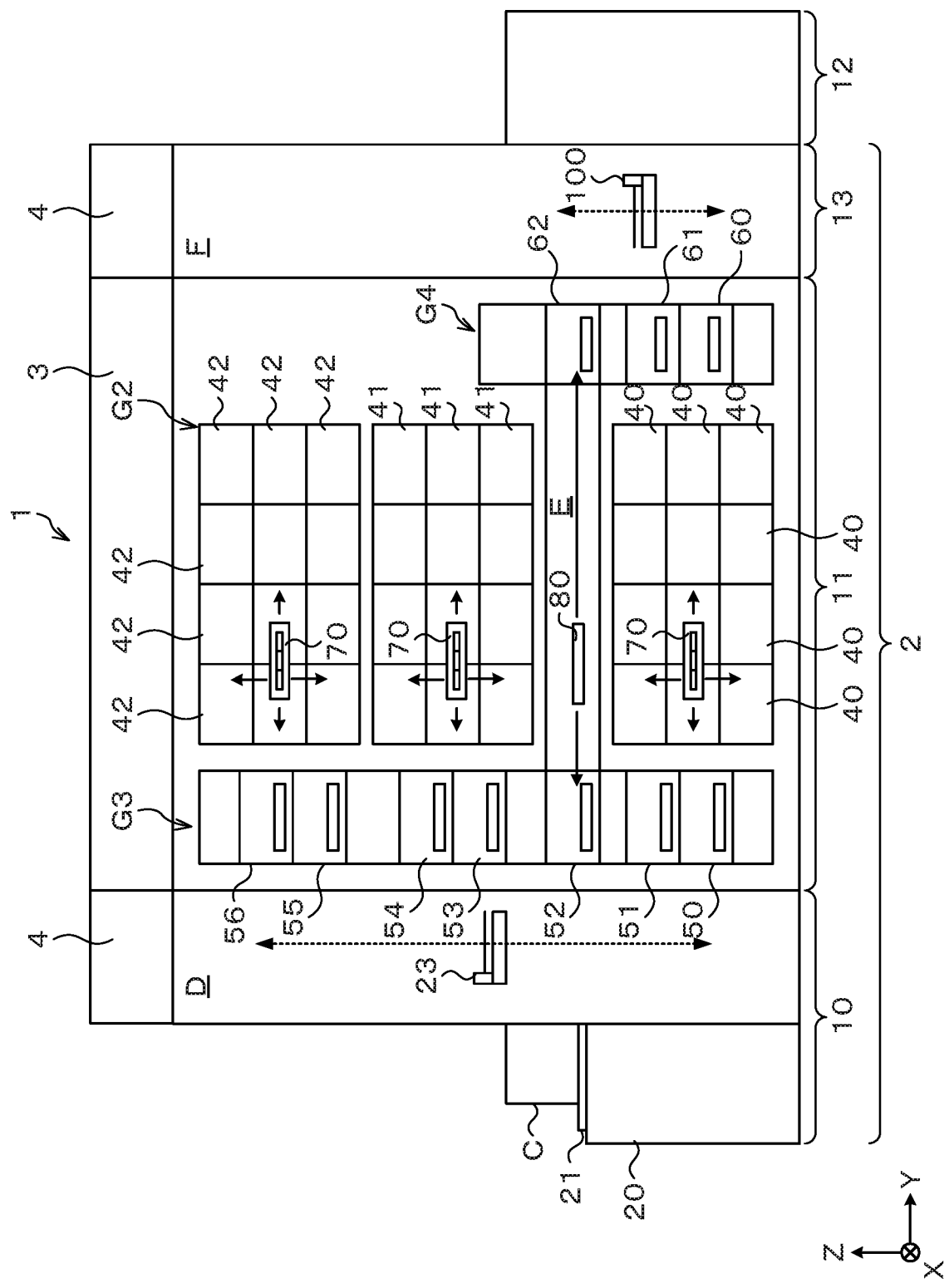
FIG. 4 is a rear view schematically illustrating the outline of the configuration of the substrate treatment apparatus according to the embodiment.

First, a configuration of a substrate treatment apparatus according to an embodiment will be described. FIG. 1 is a perspective view schematically illustrating the outline of the configuration of a substrate treatment apparatus 1. FIG. 2 is a plan view schematically illustrating the outline of the configuration of the substrate treatment apparatus 1. FIG. 3 and FIG. 4 are a front view and a rear view schematically illustrating the outline of the internal configuration of the substrate treatment apparatus 1, respectively. In the substrate treatment apparatus 1, predetermined treatments are performed on a wafer W as a substrate.

The substrate treatment apparatus 1 has, as illustrated in FIG. 1, an apparatus main body 2 including various treatment units performing predetermined treatments on the wafer W, and electric component boxes 3 and fan filter units 4 (FFUs) each configured to be attachable to and detachable from a ceiling surface of the apparatus main body 2. In the electric component boxes 3, electrical components such as treatment units are housed. The electric component boxes 3 are mainly provided above later-described first block G1 and second block G2. The fan filter units 4 supply clean air to the apparatus main body 2. The fan filter units 4 are mainly provided above later-described wafer transfer regions D to F, respectively.

The apparatus main body 2 has, as illustrated in FIG. 1 and FIG. 2, a configuration in which a cassette station 10 into/out of which a cassette C housing a plurality of wafers W is transferred, a treatment station 11 which includes a plurality of various treatment units performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment apparatus 1.

In the cassette station 10, a wafer transfer region D is formed adjacent to the cassette mounting table 20. In the wafer transfer region D, a wafer transfer unit 23 is provided which is movable on a transfer path 22 extending in an X-direction as illustrated in FIG. 2. The wafer transfer unit 23 is movable also in a vertical direction and around a vertical axis (in a θ-direction), and can transfer the wafer W between the cassette C on each of the cassette mounting plates 21 and a later-described delivery unit in a third block G3 in the treatment station 11.

Above the wafer transfer region D, the fan filter units 4 are provided as illustrated in FIG. 3 and FIG. 4. By the fan filter units 4, a downflow of clean air is formed inside the wafer transfer region D. Note that above the wafer transfer region D, an electric component box may be additionally provided.

In the treatment station 11, a plurality of, for example, four blocks each including various units, namely, a first block G1 to a fourth block G4 are provided as illustrated in FIG. 2. For example, the first block G1 is provided on the front side (X-direction negative direction side in FIG. 2) in the treatment station 11, and the second block G2 is provided on the rear side (X-direction positive direction side in FIG. 2, the upper side in the drawing) in the treatment station 11. Further, the aforementioned third block G3 is provided on the cassette station 10 side (Y-direction negative direction side in FIG. 2) in the treatment station 11, and the fourth block G4 is provided on the interface station 13 side (Y-direction positive direction side in FIG. 2) in the treatment station 11.

In the first block G1, as illustrated in FIG. 3, a plurality of solution treatment units, for example, a developing treatment unit 30 which performs a developing treatment on the wafer W, a lower anti-reflection film forming unit 31 which forms an anti-reflection film (hereinafter, referred to as a "lower anti-reflection film") at a lower layer of a resist film of the wafer W, a resist coating unit 32 which applies a resist solution to the wafer W to form a resist film, and an upper anti-reflection film forming unit 33 which forms an anti-reflection film (hereinafter, referred to as an "upper anti-reflection film") at an upper layer of the resist film of the wafer W, are arranged in this order from the bottom.

The developing treatment unit 30, the lower anti-reflection film forming unit 31, the resist coating unit 32, and the upper anti-reflection film forming unit 33 are arranged three each side by side in the horizontal direction. Note that the numbers and the arrangement of the developing treatment units 30, the lower anti-reflection film forming units 31, the resist coating units 32, and the upper anti-reflection film forming units 33 can be arbitrarily selected.

Above the first block G1, the electric component box 3 is attachably and detachably provided. Note that above the first block G1, a fan filter unit may be additionally provided.

In the second block G2, as illustrated in FIG. 4, thermal treatment units 40 each of which performs thermal treatments such as heating and cooling on the wafer W, hydrophobizing treatment units 41 each of which performs a hydrophobizing treatment for enhancing fixation between a resist solution and the wafer W, and edge exposure units 42 each of which exposes the outer peripheral portion of the wafer W to light, are provided side by side in the vertical direction and in the horizontal direction. The numbers and the arrangement of the thermal treatment units 40, the hydrophobizing treatment units 41, and the edge exposure units 42 can also be arbitrarily selected.

Above the second block G2, the electric component box 3 is attachably and detachably provided. Note that above the second block G2, a fan filter unit may be additionally provided.

In the third block G3, a plurality of delivery units 50, 51, 52, 53, 54, 55, 56 are provided in order from the bottom. Further, in the fourth block G4, a plurality of delivery units 60, 61, 62 are provided in order from the bottom.

As illustrated in FIG. 2, a wafer transfer region E is formed in a region surrounded by the first block G1 to the fourth block G4. In the wafer transfer region E, for example, a plurality of wafer transfer units 70 are arranged each of which has a transfer arm 70a movable, for example, in the Y-direction, the X-direction, the θ-direction, and the vertical direction. The wafer transfer unit 70 can move in the wafer transfer region E to transfer the wafer W to a predetermined unit in the first block G1, the second block G2, the third block G3 and the fourth block G4 therearound.

Above the wafer transfer region E, the fan filter unit 4 is provided as illustrated in FIG. 1. The fan filter unit 4 forms a downflow of clean air inside the wafer transfer region E. Note that above the wafer transfer region E, an electric component box may be additionally provided.

Further, in the wafer transfer region E, a shuttle transfer unit 80 is provided which linearly transfers the wafer W between the third block G3 and the fourth block G4 as illustrated in FIG. 4.

The shuttle transfer unit 80 is configured to be linearly movable, for example, in the Y-direction in FIG. 4. The shuttle transfer unit 80 can move in the Y-direction while supporting the wafer W, and transfer the wafer W between the delivery unit 52 in the third block G3 and the delivery unit 62 in the fourth block G4.

As illustrated in FIG. 2, a wafer transfer unit 90 is provided adjacent on the X-direction positive direction side of the third block G3. The wafer transfer unit 90 has a transfer arm 90a that is movable, for example, in the X-direction, the θ-direction, and the vertical direction. The wafer transfer unit 90 can move up and down while supporting the wafer W to transfer the wafer W to each of the delivery units in the third block G3.

In the interface station 13, a wafer transfer unit 100 and a delivery unit 101 are provided. The wafer transfer unit 100 has a transfer arm 100a that is movable, for example, in the Y-direction, the θ-direction, and the vertical direction in a wafer transfer region F. The wafer transfer unit 100 can transfer the wafer W to/from each of the delivery units in the fourth block G4, the delivery unit 101, and the exposure apparatus 12, for example, while supporting the wafer W by the transfer arm 100a.

Above the wafer transfer region F, the fan filter unit 4 is provided as illustrated in FIG. 3 and FIG. 4. The fan filter unit 4 forms a downflow of clean air inside the wafer transfer region F. Note that above the wafer transfer region F, an electric component box may be additionally provided.

In the above substrate treatment apparatus 1, a control unit 200 is provided as illustrated in FIG. 2. The control unit 200 is, for example, a computer and includes a program storage unit (not illustrated). In the program storage unit, a program for controlling the treatments on the wafer W in the substrate treatment apparatus 1 is stored. In addition, programs for realizing a later-described developing treatment in the substrate treatment apparatus 1 by controlling the operations of the above-described various treatment units and the drive system such as the transfer units, are also stored in the program storage unit. Note that the programs may be the ones that are recorded, for example, in a computer-readable storage medium such as a computer-readable hard disk (HD), flexible disk (FD), compact disk (CD), magneto-optical disk (MO), or memory card, and installed from the storage medium into the control unit 200.

<Operation of the Substrate Treatment Apparatus>

Next, the wafer treatment performed using the substrate treatment apparatus 1 configured as described above will be described.

First, a cassette C housing a plurality of wafers W is transferred into the cassette station 10 of the substrate treatment apparatus 1 and mounted on the cassette mounting plate 21. Then, each of the wafers W in the cassette C is successively taken out by the wafer transfer unit 23 and transferred to the delivery unit 53 in the third block G3 in the treatment station 11.

The wafer W is then transferred by the wafer transfer unit 70 to the thermal treatment unit 40 in the second block G2 and subjected to a temperature regulation treatment. Thereafter, the wafer W is transferred by the wafer transfer unit 70, for example, to the lower anti-reflection film forming unit 31 in the first block G1, in which a lower anti-reflection film is formed on the wafer W. The wafer W is thereafter transferred to the thermal treatment unit 40 in the second block G2 and subjected to a heat treatment. The wafer W is thereafter returned to the delivery unit 53 in the third block G3.

The wafer W is then transferred by the wafer transfer unit 90 to the delivery unit 54 in the same third block G3. The wafer W is thereafter transferred by the wafer transfer unit 70 to the hydrophobizing treatment unit 41 in the second block G2 and subjected to a hydrophobizing treatment.

The wafer W is then transferred by the wafer transfer unit 70 to the resist coating unit 32, in which a resist film is formed on the wafer W. The wafer W is thereafter transferred by the wafer transfer unit 70 to the thermal treatment unit 40 and subjected to a pre-baking treatment. The wafer W is thereafter transferred by the wafer transfer unit 70 to the delivery unit 55 in the third block G3.

Then, the wafer W is transferred by the wafer transfer unit 70 to the upper anti-reflection film forming unit 33, in which an upper anti-reflection film is formed on the wafer W. The wafer W is thereafter transferred by the wafer transfer unit 70 to the thermal treatment unit 40 and heated to be temperature-regulated. Thereafter, the wafer W is transferred to the edge exposure unit 42 and subjected to edge exposure processing.

The wafer W is thereafter transferred by the wafer transfer unit 70 to the delivery unit 56 in the third block G3.

Then, the wafer W is transferred by the wafer transfer unit 90 to the delivery unit 52, and transferred by the shuttle transfer unit 80 to the delivery unit 62 in the fourth block G4. The wafer W is thereafter transferred by the wafer transfer unit 100 in the interface station 13 to the exposure apparatus 12 and subjected to exposure processing in a predetermined pattern.

Then, the wafer W is transferred by the wafer transfer unit 100 to the delivery unit 60 in the fourth block G4. The wafer W is then transferred by the wafer transfer unit 70 to the thermal treatment unit 40 and subjected to a post-exposure baking treatment.

The wafer W is then transferred by the wafer transfer unit 70 to the developing treatment unit 30 and developed. After completion of the development, the wafer W is transferred by the wafer transfer unit 90 to the thermal treatment unit 40 and subjected to a post-baking treatment.

The wafer W is thereafter transferred by the wafer transfer unit 70 to the delivery unit 50 in the third block G3, and then transferred by the wafer transfer unit 23 in the cassette station 10 to the cassette C on the predetermined cassette mounting plate 21. Thus, a series of photolithography process ends.

<Configurations of the Ceiling Surface of the Apparatus Main Body and the Electric Component Box>

Figure 5:
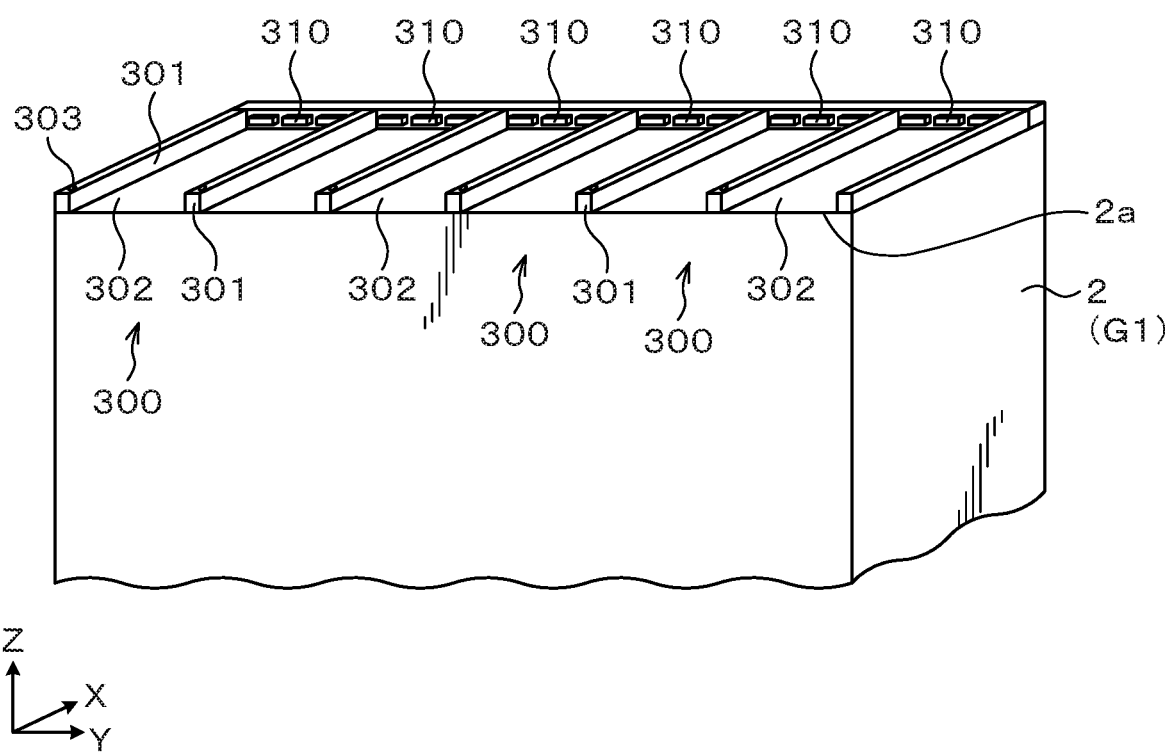
FIG. 5 is a perspective view schematically illustrating the outline of a configuration of a ceiling surface of an apparatus main body.
Figure 7:
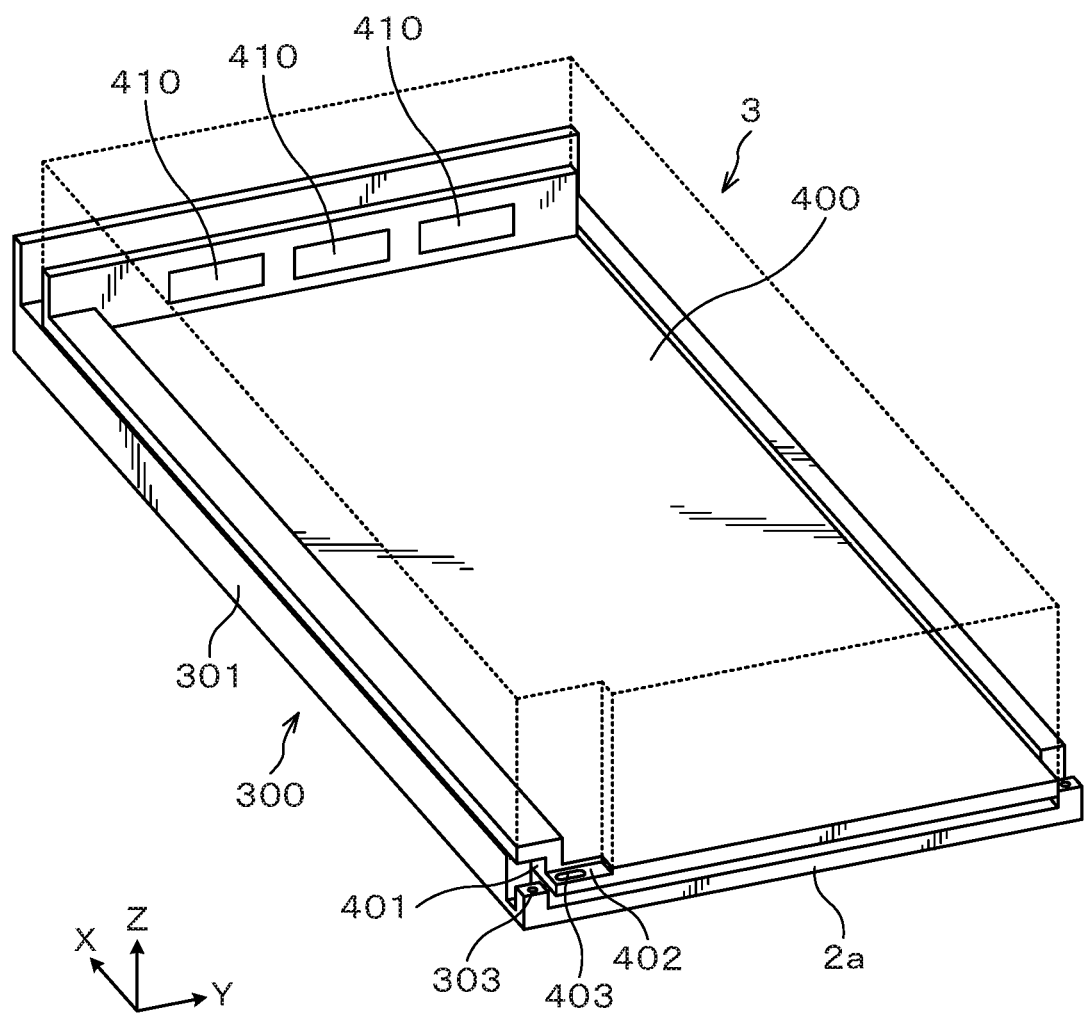
FIG. 7 is an explanatory view illustrating an appearance where the electric component box is attached to the ceiling surface of the apparatus main body.

Next, the configurations of the ceiling surface of the apparatus main body 2 and the electric component box 3 will be described. FIG. 5 is a perspective view schematically illustrating the outline of the configuration of a ceiling surface 2a of the apparatus main body 2. FIG. 6 is a perspective view schematically illustrating the outline of the configuration of the electric component box 3. FIG. 7 is an explanatory view illustrating an appearance where the electric component box 3 is provided on the ceiling surface 2a.

Note that the electric component boxes 3 are provided above the first block G1 and the second block G2 as described above, and the case where the electric component box 3 is provided above the first block G1 will be described below.

(Configuration of the Ceiling Surface of the Apparatus Main Body)

The ceiling surface 2a of the apparatus main body 2 is provided with a guide part 300 for attaching to and detaching from the electric component box 3 to the ceiling surface 2a, and a receptacle part 310 as a main body side connection part as illustrated in FIG. 5.

The guide part 300 provided on the ceiling surface 2a is a guide for moving the electric component box 3 in an X-direction and attaching and detaching the electric component box 3 to/from the ceiling surface 2a. On the ceiling surface 2a, a plurality of guide parts 300 are arranged side by side in a Y-direction so that a plurality of electric component boxes 3 are attachable to and detachable from the ceiling surface 2a along the guide parts 300.

The guide part 300 includes a guide rail 301 and a friction reducing film 302 as a friction reducing member. The guide rail 301 is provided extending in the X-direction on the ceiling surface 2a. Further, the guide rail 301 has a hollow structure so that a cable and the like are installed therein. The electric component box 3 is configured to move in the X-direction between adjacent guide rails 301 as will be described later.

Further, at an end part on an X-direction negative direction side of the guide rail 301 in the guide part 300, a fulcrum hole 303 into which a fulcrum part 510 of a later-described connection assisting jig 500 is to be inserted is formed. The fulcrum hole 303 has a circular shape in plan view.

The friction reducing film 302 is formed on the ceiling surface 2a between adjacent guide rails 301. The friction reducing film 302 reduces the friction between the ceiling surface 2a and a bottom surface of the electric component box 3. Thus, when the electric component box 3 moves between the adjacent guide rails 301 as described later, the friction reducing film 302 can make the movement of the electric component box 3 smooth. Note that the film kind of the friction reducing film 302 is not particularly limited as long as it reduces the friction and, for example, a fluororesin film is used.

Figure 8:
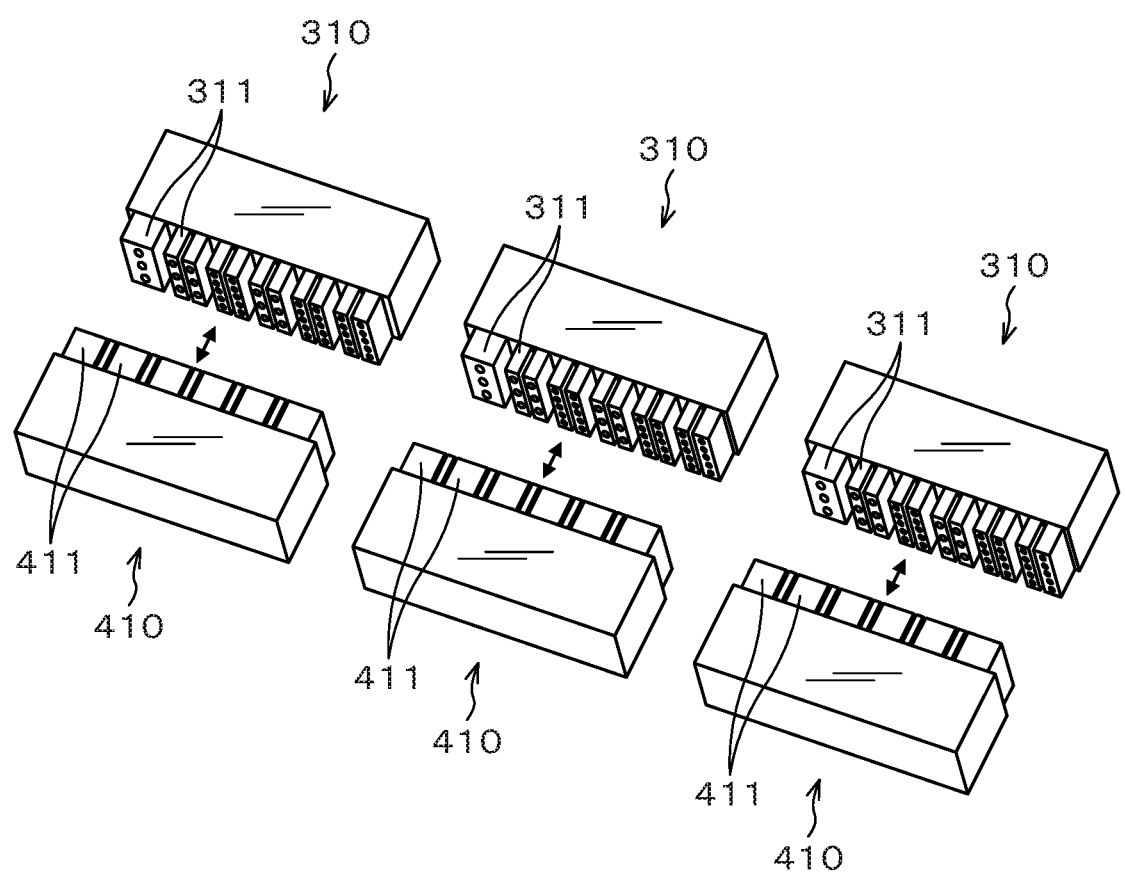
FIG. 8 is a perspective view schematically illustrating the outline of configurations of plug parts and receptacle parts.

A plurality of, for example, three receptacle parts 310 are provided between the adjacent guide rails 301, at an end part on an X-direction positive direction side of the guide part 300 on the ceiling surface 2a. The receptacle part 310 is a connection connector connected to the electric devices such as the treatment units 30 to 33, 40 to 42, and the transfer units 23, 70, 80, 90, 100 and is a multielectrode connector including a plurality of receptacles 311 as illustrated in FIG. 8. Each of the receptacle parts 310 is fitted into a later-described plug part 410 of the electric component box 3.

(Configuration of the Electric Component Box)

The electric component box 3 has a casing 400 in an almost rectangular shape as illustrated in FIG. 6. Inside the casing 400, electrical components are housed. The electrical components include a control device, an amplifier, a power supply, a driver, a contactor, a breaker and so on.

On a lower surface on a Y-direction negative direction side of the casing 400, a groove 401 extending in the X-direction is formed. The casing 400 is configured to be mounted on the guide rail 301 by the groove 401 and to be movable in the X-direction along the guide rail 301 as illustrated in FIG. 7. Note that an upper part of the casing 400 is expressed by a dotted line in FIG. 7 for easy explanation.

Further, as illustrated in FIG. 6, a cutout 402 for arranging the later-described connection assisting jig 500 therein is formed on the Y-direction negative direction side and on the X-direction negative direction side of the casing 400. At the cutout 402, a load point hole 403 into which a load point part 511 of the connection assisting jig 500 is to be inserted is formed. The load point hole 403 has an oval shape in plan view.

On one outer side surface of the casing 400, a plug part 410 as a casing side connection part is provided. The same number as that of receptacle parts 310 between adjacent guide rails 301, for example, three plug parts 410 are provided. The plug part 410 is a connection connector connected to the electric devices housed inside the casing 400 as illustrated in FIG. 8, and is a multielectrode connector including a plurality of plugs 411. Each of the plugs 411 at the plug part 410 corresponds to each of receptacles 311 of the receptacle part 310. The plug part 410 and the receptacle part 310 are configured to be fitted into each other.

<Configuration of the Connection Assisting Mechanism>

Figure 9:
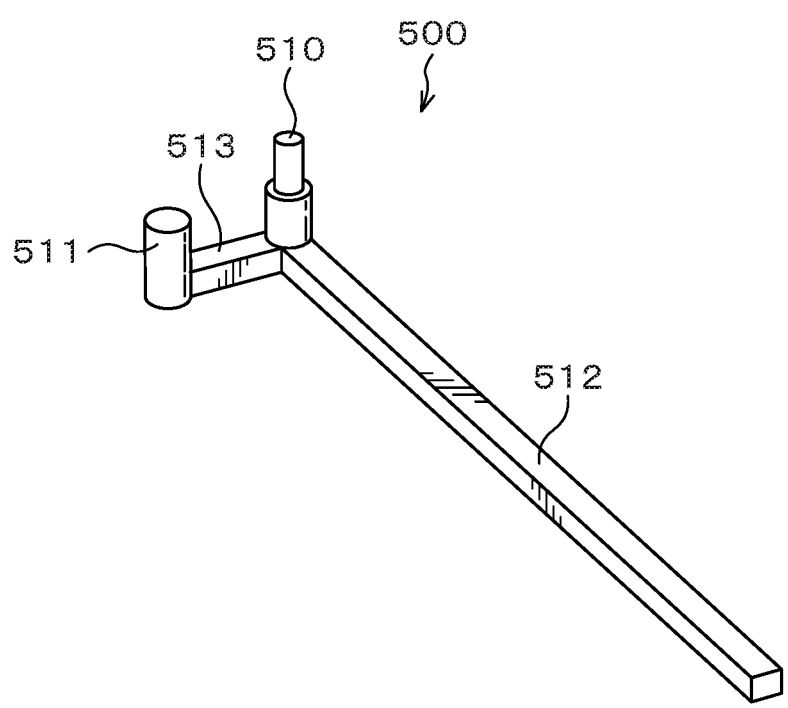
FIG. 9 is a perspective view schematically illustrating the outline of a configuration of a connection assisting jig.
Figure 10:
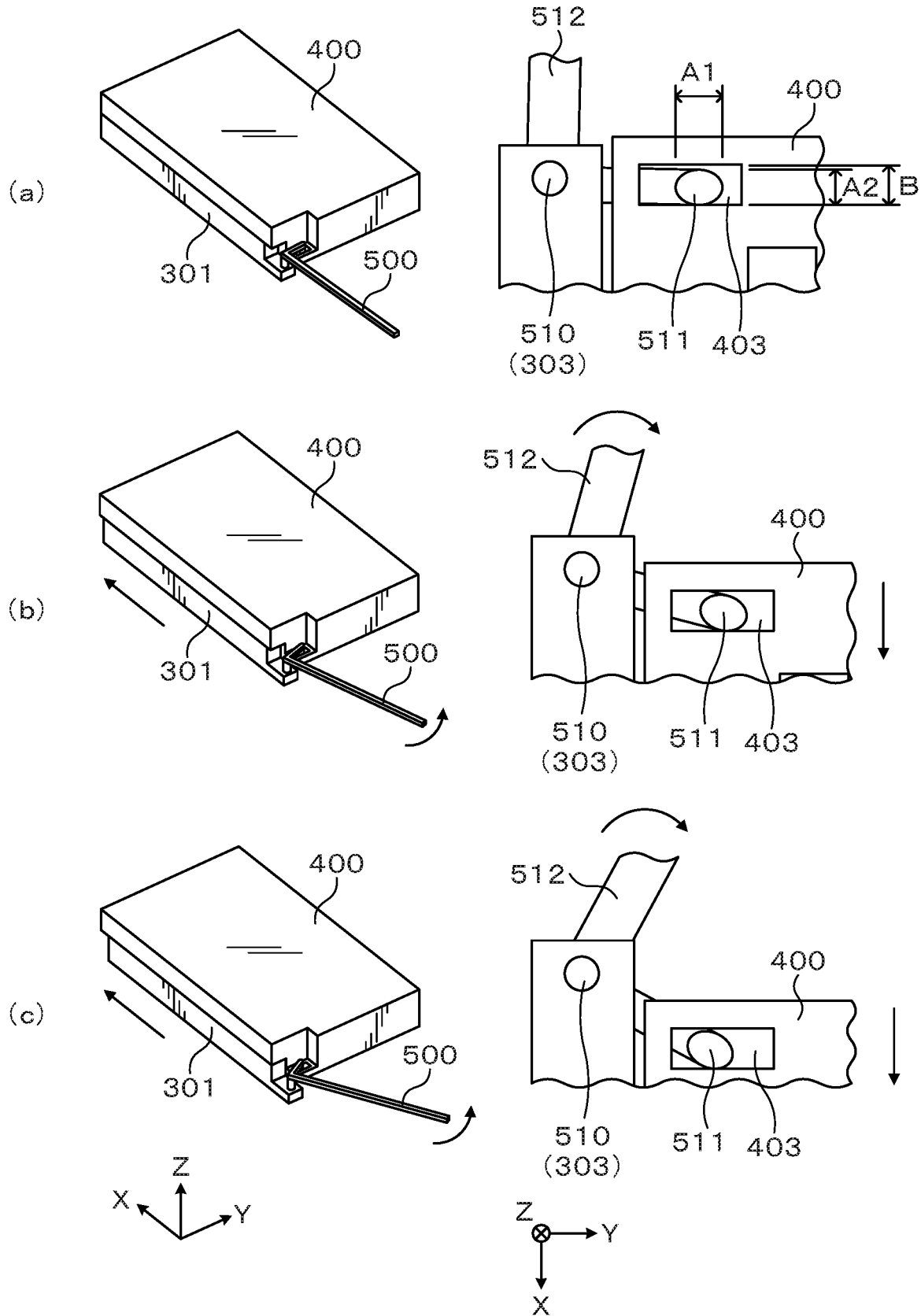
FIG. 10 is an explanatory view illustrating an appearance where the plug parts and the receptacle parts are fitted into each other using the connection assisting jig.

Next, a configuration of the connection assisting mechanism will be described. The connection assisting mechanism uses a so-called principle of leverage to fit the plug parts 410 and the receptacle parts 310 into each other while moving the casing 400 in the X-direction with respect to the guide part 300. FIG. 9 is a perspective view schematically illustrating the outline of the configuration of the connection assisting jig 500 included in the connection assisting mechanism. FIG. 10 is an explanatory view illustrating an appearance where the plug parts 410 and the receptacle parts 310 are fitted into each other using the connection assisting jig 500. In FIG. 10(a) to (c), left views are perspective views as viewed from obliquely above, and right views are plan views as viewed from below. Note that the connection assisting mechanism is composed of the connection assisting jig 500, the above-described fulcrum hole 303 of the guide part 300, and the load point hole 403 of the casing 400.

The connection assisting jig 500 has the fulcrum part 510, the load point part 511, and an effort point part 512 as illustrated in FIG. 9.

The fulcrum part 510 has a circular cylindrical shape in a plan view shape. The fulcrum part 510 is inserted into the fulcrum hole 303 of the guide part 300 as illustrated in FIG. 10.

The load point part 511 has an oval cylindrical shape in a plan view shape as illustrated in FIG. 9. The load point part 511 is inserted into the load point hole 403 of the casing 400 as illustrated in FIG. 10. A major axis A1 of the oval shape of the load point part 511 is longer than a width B in the X-direction of the load point hole 403. A minor axis A2 of the oval shape of the load point part 511 is shorter than the width B in the X-direction of the load point hole 403.

The fulcrum part 510 and the load point part 511 are connected by a supporting member 513 as illustrated in FIG. 9. The effort point part 512 has a bar shape extending, from the fulcrum part 510 as a base point, in a direction perpendicular to the supporting member 513. The effort point part 512 applies force on the load point part 511.

Next, a method for fitting the plug parts 410 and the receptacle parts 310 into each other using the connection assisting jig 500 having the above configuration will be described.

First, as illustrated in FIG. 10(a), the fulcrum part 510 of the connection assisting jig 500 is inserted into the fulcrum hole 303, and the load point part 511 is inserted into the load point hole 403.

Thereafter, as illustrated in FIG. 10(b), the effort point part 512 is turned around the fulcrum part 510. Then, the load point part 511 turns to come into contact with the side surface of the load point hole 403 (the inner side surface of the casing 400). Then, the casing 400 moves in the X-direction positive direction because the major axis A1 of the load point part 511 is longer than the width B of the load point hole 403 as described above.

Thereafter, as illustrated in FIG. 10(c), the effort point part 512 is further turned around the fulcrum part 510. Then, the casing 400 further moves in the X-direction positive direction, whereby the three plug parts 410 and receptacle parts 310 are collectively fitted into each other respectively. The plug part 410 and receptacle part 310 are provided with a plurality of plugs 411 and a plurality of receptacles 311 respectively. Therefore, to fit the three plug parts 410 and receptacle parts 310 into each other, a large force is required. In this regard, because of use of the principle of leverage using the connection assisting jig 500, application of a small force on the effort point part 512 can make the large force act on the load point part 511, thereby fitting the three plug parts 410 and receptacle parts 310 into each other.

Note that the case of fitting the plug parts 410 and the receptacle parts 310 into each other has been described using FIG. 10 in the above, and in a case of detaching the fitted plug parts 410 and receptacle parts 310 from each other, it is only necessary to reversely turn the effort point part 512. In other words, the operations in FIG. 10(c), FIG. 10(b), FIG. 10(a) in sequence.

The case where the electric component box 3 is configured to be attachable to and detachable from the ceiling surface 2a of the apparatus main body 2 is described in the above embodiment, and the fan filter unit 4 is also similarly configured to be attachable to and detachable from the ceiling surface 2a.

Specifically, the fan filter unit 4 has a casing having the same configuration as that of the casing 400. Inside the casing, a fan for sending out air, a filter that removes particles in the air, a pressure sensor (for example, a manometer) that measures the pressure of the air and so on are housed as predetermined components.

Further, on the outer side surface of the casing of the fan filter unit 4, a casing side connection part connected to the predetermined components is provided. In the casing side connection part, a plurality of connectors (for example, plugs and receptacles) of the electrical components for operating the predetermined components, couplers for actuators provided at the pressure sensor and so on are provided. Further, on the ceiling surface 2a, the main body side connection part is provided, and a plurality of connectors and couplers are provided also at the main body side connection part. The casing side connection part and the main body side connection part are configured to be fitted into each other.

In this case, the casing side connection part and the main body side connection part can be fitted into each other and the fitted casing side connection part and main body side connection part can be detached from each other using a connection assisting jig similar to the connection assisting jig 500.

<Method for Installing the Substrate Treatment Apparatus>

Figure 11:
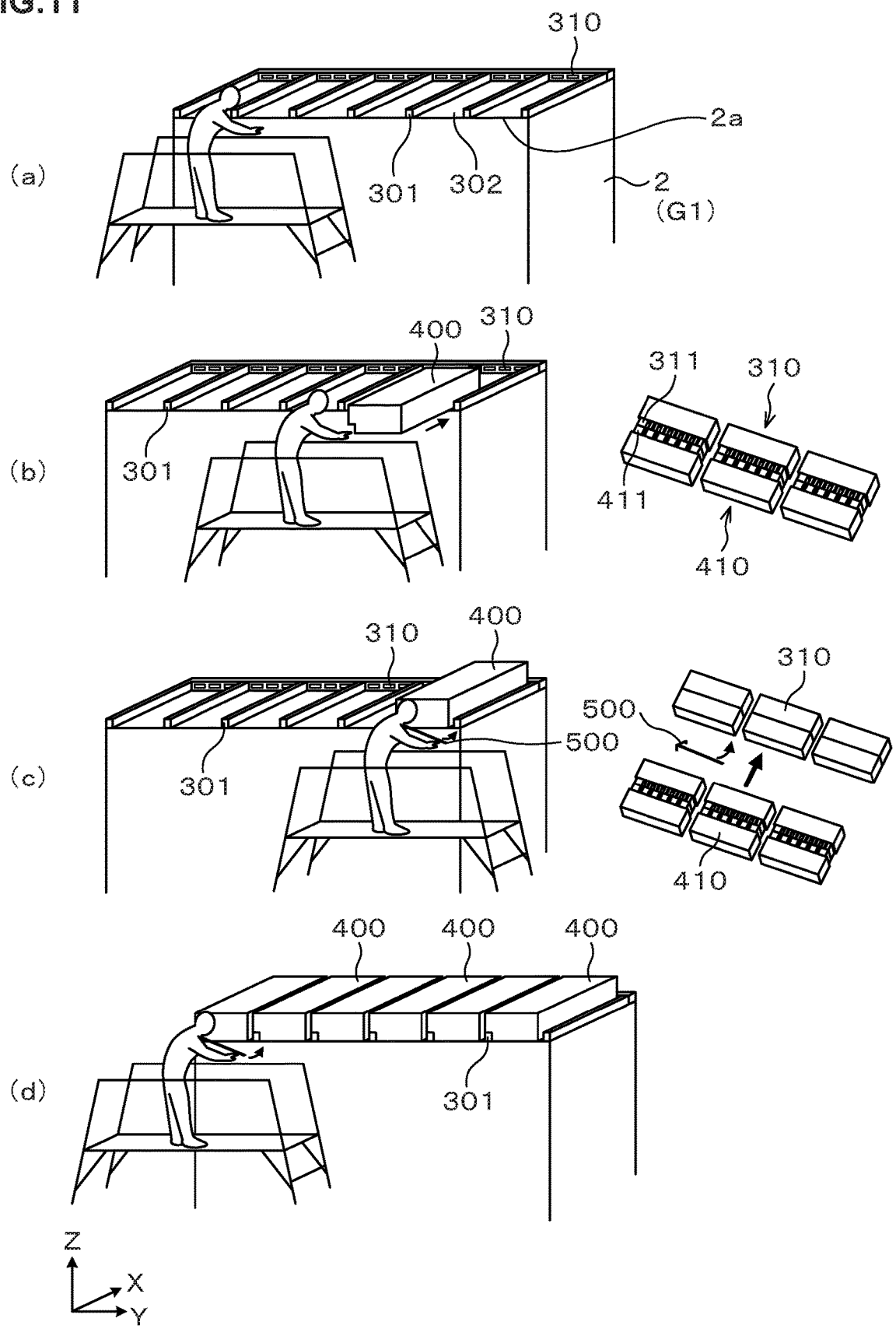
FIG. 11 is an explanatory view illustrating an appearance where the electric component boxes are attached to the apparatus main body.

Next, a method for installing the substrate treatment apparatus 1 will be described. In this embodiment, a case of individually transporting the apparatus main body 2, the electric component boxes 3, and the fan filter units 4 in a state where the electric component boxes 3 and the fan filter units 4 are detached from the apparatus main body 2, then delivering them to the site, and attaching the electric component boxes 3 and the fan filter units 4 to the apparatus main body 2, will be described. FIG. 11 is an explanatory view illustrating an appearance where the electric component boxes 3 are attached to the apparatus main body 2 (the first block G1).

As described above, in the first block G1 of the apparatus main body 2, the treatment units 30 to 33 are arranged in a stacked manner, so that the ceiling surface 2a of the apparatus main body 2 is, for example, at a height of 3 m or more from the ground. Hence, as illustrated in FIG. 11(*a*), the worker in a state of standing on a work bench attaches the electric component box 3 to the apparatus main body 2. In this embodiment, a plurality of, for example, six electric component boxes 3 are attached to the ceiling surface 2a of the apparatus main body 2 (the first block G1). Besides, each of the electric component boxes 3 has a weight allowing the worker to carry it.

First, as illustrated in a left view in FIG. 11(*b*), the worker mounts the electric component box 3 on the ceiling surface 2a and moves the electric component box 3 in the X-direction positive direction. In this event, the casing 400 is mounted on the guide rail 301 by the groove 401 and moved in the X-direction positive direction along the guide rail 301. Besides, since the friction reducing film 302 is formed on the ceiling surface 2a, the friction between the ceiling surface 2a and the bottom surface of the casing 400 is reduced, so that the worker can smoothly move the casing 400. Note that in this embodiment, the friction reducing film 302 is formed on the ceiling surface 2a, but may be formed on the bottom surface of the casing 400 or may be formed both on the ceiling surface 2a and the bottom surface of the casing 400.

The worker then moves, as illustrated in the right view of FIG. 11(*b*), the casing 400 in the X-direction positive direction until the plug 411 of the plug part 410 and the receptacle 311 of the receptacle part 310 come into contact with each other.

Here, the three plug parts 410 are provided at the casing 400, and when the electric component box 3 is attached to the ceiling surface 2a, those three plug parts 410 are collectively fitted into the corresponding three receptacle parts 310. Further, since a plurality of plugs 411 and a plurality of receptacles 311 are provided in the plug part 410 and the receptacle part 310 respectively. Therefore, to fit the three plug parts 410 and receptacle parts 310 into each other, a large force is required.

Hence, as illustrated in the left view of FIG. 11(*c*), the worker uses the connection assisting jig 500. Specifically, in a state where the fulcrum part 510 of the connection assisting jig 500 is inserted into the fulcrum hole 303 and the load point part 511 is inserted into the load point hole 403, the effort point part 512 is turned in an arrow direction in the drawing. Then, even if a force applied to the effort point part 512 is small, a large force acts on the load point part 511 owing to the principle of leverage, the casing 400 moves in the X-direction positive direction, whereby the three plug parts 410 and receptacle parts 310 are collectively fitted into each other as illustrated in the right view of FIG. 11(*c*).

Then, the worker attaches the other five electric component boxes 3 to the ceiling surface 2a in the method illustrated in FIGS. 11(*b*) and (*c*). Thus, the six electric component boxes 3 are attached to the ceiling surface 2a as illustrated in FIG. 11(*d*).

Note that the electric component boxes 3 are similarly attached also to the ceiling surface 2a of the second block G2. Further, the fan filter units 4 are similarly attached also to the ceiling surfaces 2a above the wafer transfer regions D to F.

According to the embodiment, at the time of transporting the substrate treatment apparatus 1, the electric component boxes 3 and the fan filter units 4 are detached from the apparatus main body 2, thereby enabling the height of the apparatus during the transportation to be made low. Accordingly, it is possible to clear the height limit of a transportation means such as an aircraft or a truck and appropriately transport the substrate treatment apparatus 1.

Further, at the time of attaching the electric component box 3 to the ceiling surface 2a of the apparatus main body 2 after delivering the electric component box 3 to the site, the casing 400 is moved in the X-direction positive direction by the guide part 300, and then the three plug parts 410 and the three receptacle parts 310 are collectively fitted into each other while the casing 400 is further moved in the X-direction positive direction using the connection assisting jig 500. The worker can attach the casing 400 to the ceiling surface 2a only by moving the casing 400 in the X-direction positive direction as described above. Accordingly, the work of attaching the electric component box 3 at a high place by the worker can be performed only on one side surface side (the X-direction negative direction side). Here, in a conventional work of attaching the electric component box, the worker goes up to the ceiling surface of the apparatus main body located at a high place and performs a wire-connection work of connecting a connector and laying wiring while being heavily equipped with a safety belt and so on. Therefore, the capability of performing the work of attaching the electric component box 3 only from the one side surface side of the apparatus main body 2 as in the embodiment is useful from the viewpoint of simplification and safety improvement of the work.

The wire-connection work for the electrical components in the casing 400 and the apparatus main body 2 (treatment unit) can be performed by fitting the plug parts 410 and the receptacle parts 310 into each other using the connection assisting jig 500. The conventional wire-connection work here, in which many connectors need to be connected, requires great effort and may cause wire-connection errors. In this regard, the wire-connection can be performed only by fitting the plug parts 410 and the receptacle parts 310 into each other in the embodiment, thus facilitating the work and also suppressing the wire-connection errors.

Further, the fan filter units 4 can also be attached to the ceiling surfaces 2a above the wafer transfer regions D to F in the same method as that of attaching the electric component boxes 3. Accordingly, the substrate treatment apparatus 1 can be easily and efficiently installed.

Note that the case of attaching the electric component boxes 3 and the fan filter units 4 to the ceiling surface 2a of the apparatus main body 2 is described in the above embodiment, but for shipping the substrate treatment apparatus 1, the electric component boxes 3 and the fan filter units 4 need to be detached from the ceiling surface 2a. For example, at the stage of manufacturing the substrate treatment apparatus 1, namely, before shipping it, the electric component boxes 3 and the fan filter units 4 are once attached to the ceiling surface 2a for confirming the operation of the substrate treatment apparatus 1. Therefore, for transporting the substrate treatment apparatus 1, the work of detaching the electric component boxes 3 and the fan filter units 4 becomes necessary.

Figure 12:
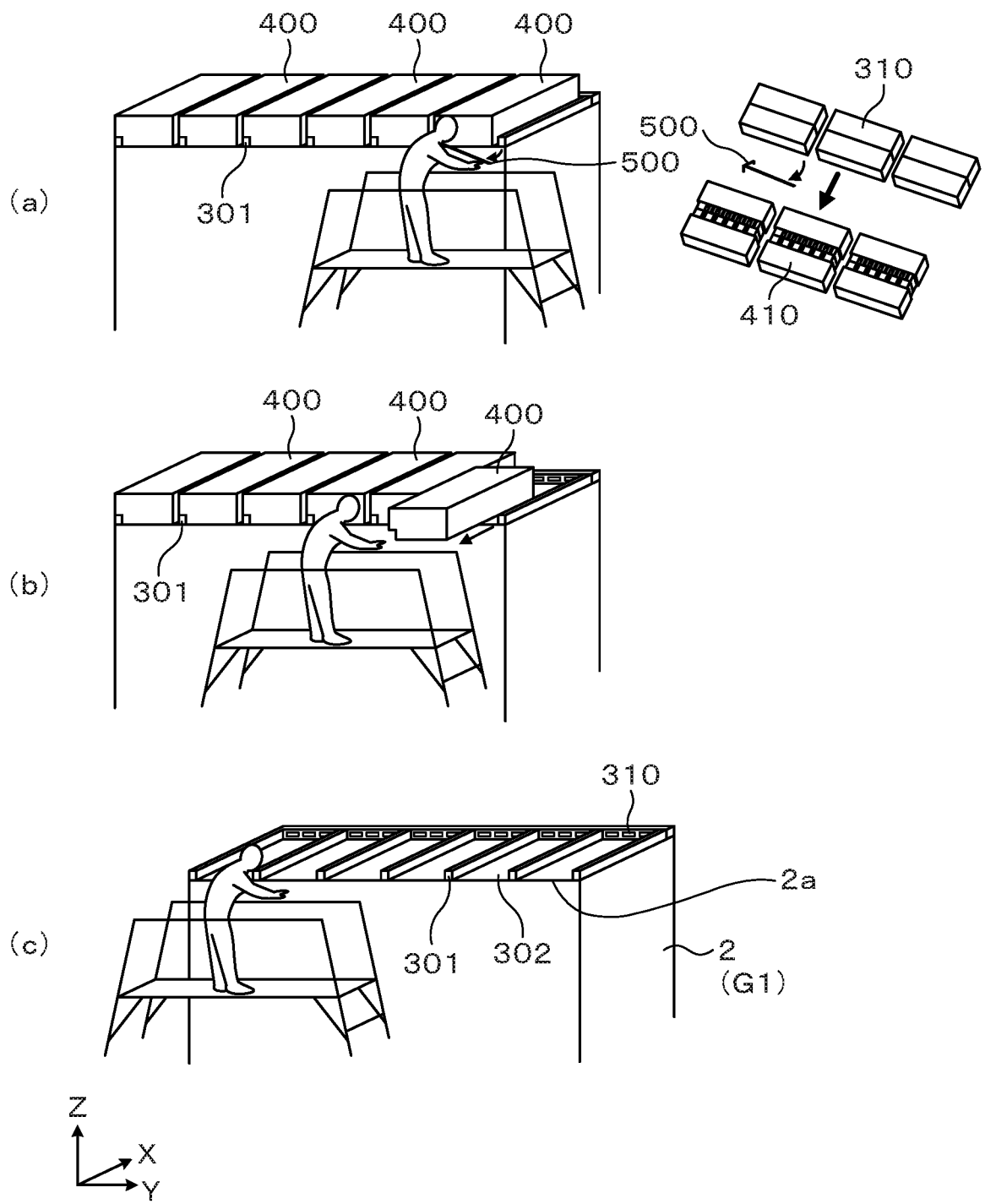
FIG. 12 is an explanatory view illustrating an appearance where the electric component boxes are detached from the apparatus main body.

Concretely, at the time of detaching the electric component boxes 3 from the ceiling surface 2a, a work reverse to that in the case of attaching the electric component boxes 3 described in FIG. 11 is performed. FIG. 12 is an explanatory view illustrating an appearance where the electric component boxes 3 are detached from the apparatus main body 2 (the first block G1).

First, in a state where the electric component boxes 3 are attached to the ceiling surface 2a as illustrated in FIG. 12(a), the fitted plug parts 410 and receptacle parts 310 are detached from each other using the connection assisting jig 500. Specifically, in a state where the fulcrum part 510 of the connection assisting jig 500 is inserted into the fulcrum hole 303 and the load point part 511 is inserted into the load point hole 403, the effort point part 512 is turned in an arrow direction in the drawing (namely, a direction opposite to the arrow direction in FIG. 11(c)). Then, the casing 400 moves in the X-direction negative direction, whereby the three plug parts 410 and receptacle parts 310 are detached from each other as illustrated in the right view of FIG. 12(a). In this event, to detach the three plug parts 410 and receptacle parts 310 from each other, a large force is required, but they can be detached from each other by a small force utilizing the principle of leverage using the connection assisting jig 500.

Thereafter, as illustrated in FIG. 12(b), the worker moves the casing 400 in the X-direction negative direction along the guide rail 301. In this event, since the friction reducing film 302 is formed on the ceiling surface 2a, the friction between the ceiling surface 2a and the bottom surface of the casing 400 is reduced, so that the worker can smoothly move the casing 400.

Then, the worker detaches also the other five electric component boxes 3 from the ceiling surface 2a by the same method. Thus, as illustrated in FIG. 12(c), the six electric component boxes 3 are detached from the ceiling surface 2a.

Note that the electric component boxes 3 are similarly detached also from the ceiling surface 2a above the second block G2. Further, the fan filter units 4 are similarly detached also from the ceiling surfaces 2a above the wafer transfer regions D to F.

As described above, the work of detaching the electric component boxes 3 (fan filter units 4) from the ceiling surface 2a can be performed only on the one side surface side (the X-direction negative direction side), and the detachment of the three plug parts 410 and the three receptacle parts 310 can be collectively performed. Here, in a conventional work of detaching the electric component box, the worker goes up to the ceiling surface of the apparatus main body located at a high place and separates the connection of many wirings. Therefore, the capability of performing the work of detaching the electric component box 3 only from the one side surface side as in the embodiment provides a great effect from the viewpoint of simplification and safety improvement of the work.

Other Embodiments

Next, other embodiments will be described.

In the above embodiment, a determination part (not illustrated) that determines the connection state between the plug part 410 and the receptacle part 310 in attaching the electric component box 3 to the ceiling surface 2a may be provided in the substrate treatment apparatus 1. The determination part may determine the connection state between the plug part 410 and the receptacle part 310 as a mechanical position of completion of fitting, or may electrically determine the connection state. As the determination part that determines the connection state as a mechanical position of completion of fitting, for example, a limit switch is used. For example, when the plug part 410 and the receptacle part 310 are fitted into each other, the limit switch is turned on to connect a power supply line. Further, when the connection state is electrically determined, a line of an LED connected to the plug part 410 side of the casing 400 is provided, for example, in advance inside the receptacle part 310, so that the LED may be turned on when the plurality of receptacles 311 of the receptacle part 310 and the plurality of plugs 411 of the plug part 410 are connected with each other. Note that since the LED is not turned on unless the power supply is connected thereto, a battery is necessary for confirmation at start and connection. By wire-connecting the limit switch, the battery, and the LED, the mechanical position (fitting position) can be determined and fixed. Once the connection is established, the battery is detached and used for the connection with another casing 400. The LED does not need to be turned on at all times after completion of the connection.

Besides, the determination result of the determination part may be displayed on a displayed part (not illustrated). Though any display method of the determination result by the display part and any installation place of the display part are adoptable, for example, an LED lamp is provided as the display part, for example, on the outer side surface of the electric component box 3. Then, for example, when the plug part 410 and the receptacle part 310 are appropriately fitted into each other, the determination result (a result of appropriate fitting performed) from the determination part may be outputted to the LED lamp to turn on the LED lamp. In this case, the connection state between the plug part 410 and the receptacle part 310 can be recognized. Then, keeping the state where the LED lamps of all of the electric component boxes 3 are turned on in a normal operation, enables the substrate treatment apparatus 1 to appropriately operate.

Note that the determination part and the display part are used also in attaching the fan filter unit 4 to the ceiling surface 2a.

In the above embodiment, to prevent improper connection between the plug part 410 and the receptacle part 310 in attaching the electric component box 3 to the ceiling surface 2a, a number is preferably given to the electric component box 3.

Further, to appropriately connect the plug parts 410 and the receptacle parts 310, bolts 610, 620, 630 may be provided on the outer side surface of the casing 400 of each electric component box 3 and through holes 611, 621, 631 may be provided in the ceiling surface 2a as illustrated in FIG. 13. The bolts 610, 620, 630 are provided at respective different positions of the casing 400, and the through holes 611, 621, 631 are provided at corresponding positions on the ceiling surface 2a.

In this case, when a first plug part 410a and a first receptacle part 310a are connected as illustrated in FIG. 13(a), the bolt 610 is inserted into the through hole 611. When a second plug part 410b and a second receptacle part 310b are connected as illustrated in FIG. 13(b), the bolt 620 is inserted into the through hole 621. When a third plug part 410c and a third receptacle part 310c are connected as illustrated in FIG. 13(c), the bolt 630 is inserted into the through hole 631.

On the other hand, for example, the first plug part 410a is tried to be connected to the second receptacle part 310b in error, the bolt 610 is not inserted into the through hole 611, so that the first plug part 410a and the second receptacle part 310b are not connected. Accordingly, improper connection between the plug part 410 and the receptacle part 310 can be prevented.

Figure 14:
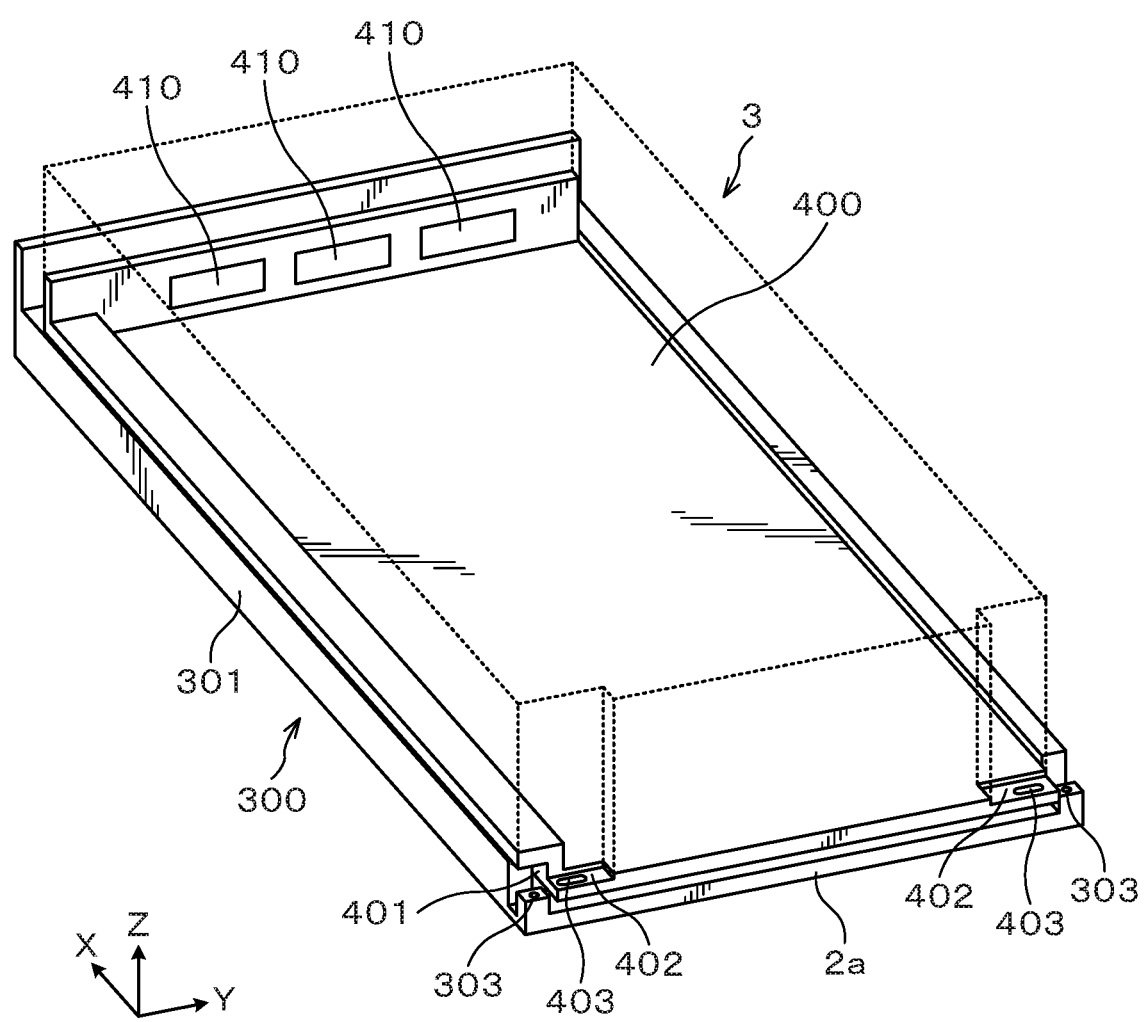
FIG. 14 is an explanatory view illustrating an appearance where the electric component box is attached to the ceiling surface of the apparatus main body in another embodiment.
Figure 15:
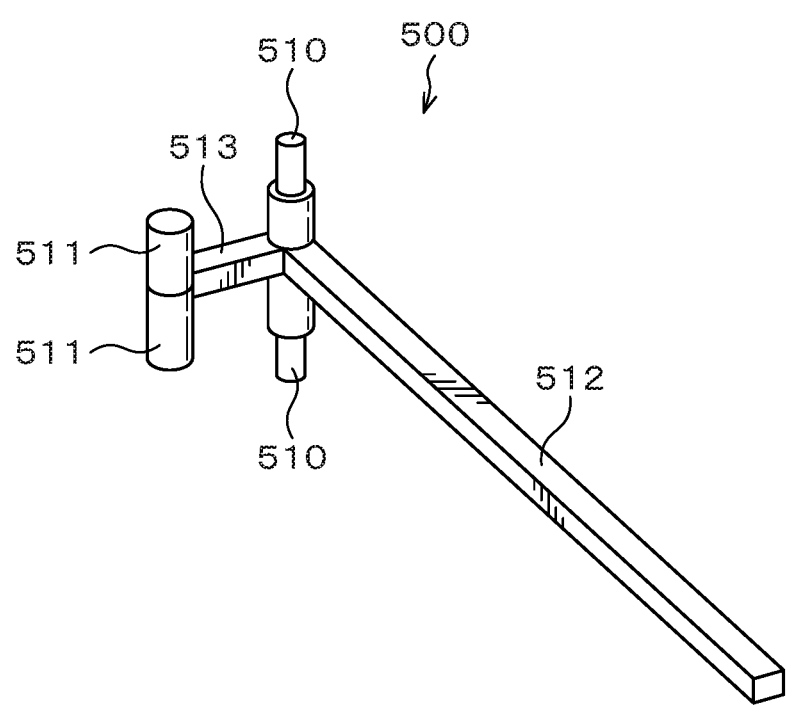
FIG. 15 is a perspective view schematically illustrating the outline of a configuration of a connection assisting jig according to another embodiment.

The plug part 410 and the receptacle part 310 are fitted into each other using one connection assisting jig 500 in the above embodiments, but the number of connection assisting jigs 500 is not limited one but, for example, two connection assisting jigs 500 may be used. In this case, the fulcrum hole 303 and the load point hole 403 are formed, for example, at both end parts in the Y-direction of the guide part 300 and the casing 400 respectively as illustrated in FIG. 14. Further, the connection assisting jig 500 is provided such that the fulcrum parts 510 and the load point parts 511 are provided to form a pair to be vertically symmetric so as to be usable at any end part of both end parts in the Y-direction as illustrated in FIG. 15. The plurality of connection assisting jigs 500 used as described above can cope with the case where a large force is required for fitting the plug part 410 and the receptacle part 310 into each other.

Further, the configuration of the connection assisting mechanism is not limited to the configuration using the connection assisting jig 500 as in the above embodiment, but may take any configuration. For example, a screw (not illustrated) may be used to move the casing 400 to fit the plug part 410 and the receptacle part 310 into each other.

Though the friction reducing film 302 is used as the friction reducing member that reduces the friction between the bottom surface of the casing 400 and the ceiling surface 2a of the apparatus main body 2 in the above embodiment, the friction reducing member is not limited to the friction reducing film 302. For example, a roller (not illustrated) may be provided on the bottom surface of the casing 400 and/or the ceiling surface 2a of the apparatus main body 2.

The case where the electric component box 3 and the fan filter unit 4 are attachable to and detachable from the ceiling surface 2a of the apparatus main body 2 is described in the above embodiment, the target which the electric component box 3 and the fan filter unit 4 are attachable to and detachable from is not limited to the ceiling surface 2a but only needs to be an upper part of the apparatus main body 2. In the case of the upper part of the apparatus main body 2, the work by the worker is a work at a high place, making the effect of performing the work from the one side surface side prominent. Further, the one which is attachable to and detachable from the apparatus main body 2 is not limited to the electric component box 3 and the fan filter unit 4 but is the one as long as it includes a casing housing predetermined components such as electrical components.

The technique according to this disclosure is useful in attaching and detaching a casing housing predetermined components to/from an upper part of an apparatus main body of a substrate treatment apparatus that treats a substrate.

The embodiments disclosed this time should be understood to be merely examples in all aspects but not limited ones. The above-described embodiments may be subjected to omission, replacement, and modification in various forms without departing from the scope and spirit of appended claims.

What is claimed is:

1. A substrate treatment apparatus for treating a substrate, the substrate treatment apparatus comprising:
    an apparatus main body configured to perform a predetermined treatment on the substrate;
    a casing configured to house a predetermined component therein and to be attachable to and detachable from an upper part of the apparatus main body;
    a casing side connection part provided at the casing and connected to the predetermined component;
    a main body side connection part provided at the upper part of the apparatus main body and configured to be fitted into the casing side connection part;
    a guide part provided at the upper part of the apparatus main body and configured to move the casing in one direction; and
    a connection assisting mechanism configured to fit the casing side connection part into the main body side connection part while moving the casing in the one direction.

2. The substrate treatment apparatus according to claim 1, further comprising:
    a determination part configured to determine a connection state between the casing side connection part and the main body side connection part.

3. The substrate treatment apparatus according to claim 2, wherein
    the determination part mechanically determines the connection state between the casing side connection part and the main body side connection part.

4. The substrate treatment apparatus according to claim 2, wherein
    the determination part electrically determines the connection state between the casing side connection part and the main body side connection part.

5. The substrate treatment apparatus according to claim 2, further comprising:
    a display part configured to display a determination result by the determination part.

6. The substrate treatment apparatus according to claim 1, wherein
    the guide part comprises:
    a guide rail extending in the one direction; and
    a friction reducing member configured to reduce a friction between a bottom surface of the casing and the upper part of the apparatus main body.

7. The substrate treatment apparatus according to claim 6, wherein
    the friction reducing member is a film formed at least at the bottom surface of the casing or the upper part of the apparatus main body.

8. The substrate treatment apparatus according to claim 6, wherein
    the friction reducing member is a roller provided at least on the bottom surface of the casing or the upper part of the apparatus main body.

9. The substrate treatment apparatus according to claim 1, wherein
    the connection assisting mechanism comprises:
    a fulcrum part to be inserted into a fulcrum hole provided in the guide part;
    a load point part to be inserted into a load point hole provided in the casing; and
    an effort point part configured to apply a force to the load point part to move the casing in the one direction.

10. The substrate treatment apparatus according to claim 9, wherein:

the load point part has an oval shape in plan view;
a major axis of the load point part is longer than a width of the load point hole in the one direction; and
a minor axis of the load point part is shorter than the width of the load point hole in the one direction.

11. The substrate treatment apparatus according to claim 1, wherein:
a plurality of pairs of the casing side connection parts and the main body side connection parts are provided; and
the connection assisting mechanism collectively fits the plurality of pairs of the casing side connection parts and the main body side connection parts into each other.

12. The substrate treatment apparatus according to claim 1, wherein
the apparatus main body has a configuration in which a plurality of treatment units are arranged opposed across a transfer region for transferring the substrate to the treatment units.

13. The substrate treatment apparatus according to claim 12, wherein:
the predetermined component is an electrical component;
the casing is a casing included in an electric component box; and
the casing is attachable to and detachable from an upper part of the treatment unit.

14. The substrate treatment apparatus according to claim 12, wherein;
the casing is a casing included in a fan filter unit configured to supply clean air to the apparatus main body; and
the casing is attachable to and detachable from an upper part of the transfer region.

* * * * *